United States Patent
Herrin et al.

(10) Patent No.: US 7,482,880 B2
(45) Date of Patent: *Jan. 27, 2009

(54) FREQUENCY MODULATED OUTPUT CLOCK FROM A DIGITAL FREQUENCY/PHASE LOCKED LOOP

(75) Inventors: Scott W. Herrin, Austin, TX (US);
Chris C. Dao, Pflugerville, TX (US);
Patrick M. Falvey, Austin, TX (US);
Thomas J. Rodriguez, Austin, TX (US);
Jules D. Campbell, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 112 days.

This patent is subject to a terminal disclaimer.

(21) Appl. No.: 11/557,721

(22) Filed: Nov. 8, 2006

(65) Prior Publication Data
US 2007/0152766 A1 Jul. 5, 2007

Related U.S. Application Data

(63) Continuation-in-part of application No. 11/323,294, filed on Dec. 30, 2005.

(51) Int. Cl.
*H03L 7/087* (2006.01)

(52) U.S. Cl. .................. 331/1 A; 331/11; 327/159; 375/376

(58) Field of Classification Search .................. 331/11, 331/16, 17, 1 A; 327/156, 157, 159; 375/373, 375/374, 375, 376; 455/260
See application file for complete search history.

(56) References Cited

U.S. PATENT DOCUMENTS

| | | | |
|---|---|---|---|
| 5,425,074 A * | 6/1995 | Wong | 377/47 |
| 5,534,821 A * | 7/1996 | Akiyama et al. | 331/8 |
| 7,282,999 B2 * | 10/2007 | Da Dalt et al. | 331/1 A |
| 2004/0213324 A1 * | 10/2004 | Hall et al. | 375/130 |
| 2005/0122045 A1 * | 6/2005 | Sung et al. | 313/582 |
| 2007/0153952 A1 * | 7/2007 | Herrin et al. | 375/376 |

* cited by examiner

*Primary Examiner*—Robert Pascal
*Assistant Examiner*—Ryan J. Johnson
(74) *Attorney, Agent, or Firm*—Dillon & Yudell LLP

(57) ABSTRACT

A frequency modulated output of a Digital Locked Loop (DLL) is implemented with a Johnson Counter outputting a sample clock and a synchronized digital code at a multiple of the sample clock. The digital code drives a digital-to-analog converter to generate a frequency modulated control signal. The control signal is summed with the center frequency control from the digital locked loop digital filter to provide a frequency modulated center frequency control signal to the DLL oscillator.

15 Claims, 4 Drawing Sheets

FREQUENCY MODULATED OUTPUT CLOCK FROM A DIGITAL FREQUENCY/PHASE LOCKED LOOP

PRIORITY CLAIM

This application Is a continuation-in-part of U.S. patent application Ser. No. 11/323,294 "Frequency Modulated Output Clock From A Digital Frequency/Phase Locked Loop" filed on Dec. 30, 2005.

BACKGROUND OF THE INVENTION

1. Field of the Invention

The present invention relates generally to a digital phase locked loop, and in particular to a digital phase locked loop that generates a frequency modulated output clock.

2. Description of the Related Art

Phase locked loops (PLL) have been widely used in communication systems or the like, some frequently appearing in applications such as extracting information from carrier waves or synchronous signals. A phase locked loop is a well-known clock synchronization technique to drive a timing signal, synchronized or locked, to a reference clock signal.

A PLL is a frequency-selective circuit generally containing a phase comparator, a low-pass filter, and a controllable oscillator, whose own output is coupled in a feedback arrangement to one of the phase comparator inputs. When an input or reference clock signal is applied to the PLL, the phase comparator compares the phase of the oscillator output signal to the phase of the reference clock signal and generates an error signal that is related to both the frequency and the phase relationship between the two signals. This error signal is filtered, buffered and applied to the oscillator, thus driving the oscillator output signal frequency in a direction to more closely equate its frequency, to that of the reference clock signal frequency. When the oscillator output frequency is sufficiently close to the reference frequency, usually within a few percent, the PLL will be in a "frequency locked" condition. Next, the phase detector and the feedback nature of the PLL cause the oscillator to substantially align each of the oscillator clock output rising edges to the rising edges of the reference clock signal frequency, with the exception of some small but finite phase difference. This point is called the "zero phase error." While the phases may not be perfectly aligned, their frequencies are sufficiently matched such that the amount of phase difference remains substantially constant, except for the small effects of noise. The self-correcting nature of the PLL thus allows the system to track any small frequency changes of the reference clock signal once it is locked. A frequency divider is often inserted in the feedback loop when the desired output frequency of the oscillator is to be a multiple of the reference clock signal frequency.

In combination with a digital phase detector, fully-digital PLLs usually include a digital loop filter instead of the traditional analog filter, and often include a digitally-controlled oscillator (DCO) instead of a current-controlled oscillator (ICO) or voltage-controlled oscillator (VCO). In theory, these fully digital PLLs have several advantages over their analog counterparts. First, digital logic exhibits much better noise immunity than analog circuitry. Second, analog components are vulnerable to DC offset and drift phenomena that are not present in equivalent digital implementations. Further, the loop dynamics of analog PLLs are quite sensitive to process technology scaling, and therefore require significant design and simulation efforts, whereas the functional behavior of digital logic remains essentially unchanged with scaling, although its parametric behavior does change. Moreover, power dissipation is of extreme concern for portable, battery-powered, computing or communication systems. Thus, Digital PLLs generally enable a relaxation of the power supply voltage requirements of integrated circuits.

As is known in the art, high frequency clock generation circuits such as those used in portable, electronic devices can produce significant levels of electromagnetic interference (EMI). This can be particularly detrimental in portable, wireless communication applications. Consequently, manufacturers of wireless communication devices, such as cell phones, employ various techniques to reduce the EMI produced by such high frequency components. One technique employed to reduce EMI generated by a PLL clock generation circuit is to frequency modulate the oscillator of the PLL by various means. The benefit of frequency modulation is to spread the energy of the output signal over a wider frequency range and thereby effect a reduction in the measured intensity of EMI, as well as its adverse effects on nearby radio receivers.

FIG. 1 is a block diagram of a typical PLL 100 of the prior art using frequency modulation on its output to reduce the circuit's generation of EMI. The PLL 100 includes a phase detector 110 having a first input for the referenced clock signal and a second input for the feedback signal. The output of the phase detector 110 is coupled to the input of a digital filter 120. The output of the digital filter 120 is coupled to a first input of an adder 130, and a second input of adder 130 receives a frequency modulation control signal ($f_m$). The frequency modulation control signal ($f_m$) is generated through a separate oscillation system. The output of adder 130 is coupled to an input of a controllable oscillator 140, which generates an oscillating clock signal on its output. The output of controllable oscillator 140 is also coupled to an input of frequency divider 150. An output of frequency divider 150 is coupled to the second input of phase detector 110. Thus, the output of controllable oscillator 140 is coupled through the frequency divider 150, to operate as the feedback signal to the second input of phase detector 110.

As will be appreciated, if the inherent variations in clock generation systems are non-linear, they may cause the injected frequency modulation signal to shift the average center frequency output of controllable oscillator 140. Without precise synchronization of the reference clock signal and the frequency modulation signal, there may be significant fluctuations in the average clock frequency output of the digital PLL. Moreover, the additional circuitry required to generate the frequency modulation control signal further complicates the overall digital circuitry of the integrated circuit.

For the reasons stated above, and for other reasons which will become apparent to those skilled in the art upon reading and understanding the present specification, there is a need in the art for an alternative digital locked loop system capable of establishing a digital frequency or phase locked loop output clock having frequency modulation without altering the average system frequency output and with minimal added complexity.

BRIEF DESCRIPTION OF THE DRAWINGS

This invention is described in a preferred embodiment in the following description with reference to the drawings, in which like numbers represent the same or similar elements, as follows.

In the following detailed description of exemplary embodiments of the invention, reference is made to the accompanying drawings, which form a part hereof, and in which is shown by way of illustration specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, but it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, although the preferred embodiment is described below with respect to a wireless mobile communication device, it will be appreciated that the present invention is not so limited and that it has application to other embodiments of electronic devices such as portable digital assistants, digital cameras, portable storage devices, audio players and portable gaming devices, or real time control of electrical or mechanical systems, for example.

Figure 1:
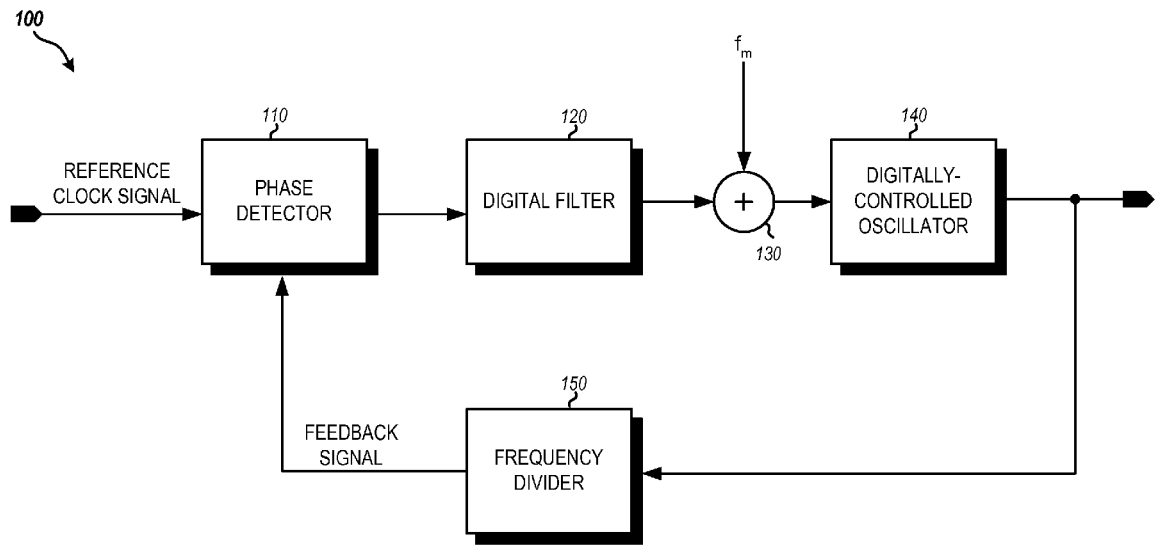
FIG. 1 is a block diagram of a typical PLL of the prior art using frequency modulation on its output to reduce the circuit's generation of EMI.
Figure 2:
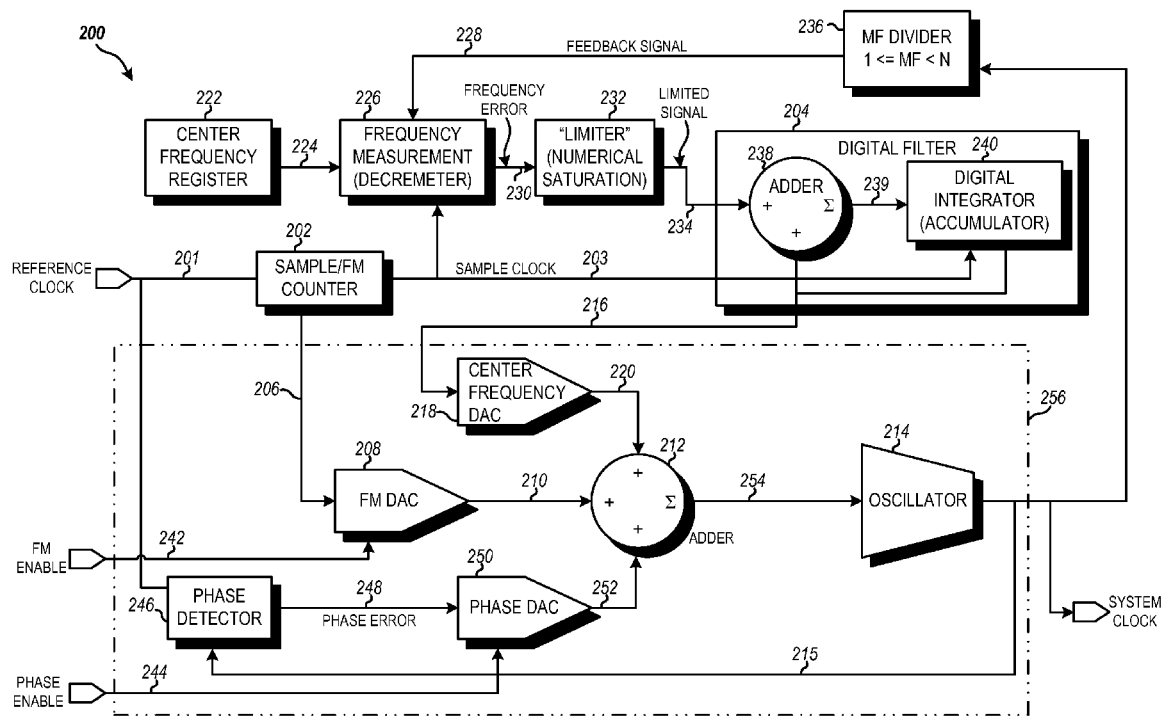
FIG. 2 shows a frequency-modulated digital locked loop, in accordance with a preferred embodiment of the present invention.

With reference now to FIG. 2, there is shown a frequency-modulated digital locked loop, in accordance with a preferred embodiment of the present invention. A digital locked loop (DLL) is any digital locked loop circuit such as a phase or frequency locked loop circuit. DLL 200 shown in FIG. 2 can be a phase or frequency locked loop circuits in alternative embodiments or operating modes.

DLL 200 includes a sample/frequency modulation counter 202 having an input for receiving reference clock 201. Sample/frequency modulation counter 202 has a first output whose signal is sample clock 203 to provide the sampling frequency of the DLL 200. Counter 202 has a second output connected to signal bus 206 which is coupled to FM DAC 208. In a preferred embodiment, sample/frequency modulation counter 202 takes the form of the well-known Johnson Counter. Circuit designers have frequently utilized Johnson counters to facilitate synthesis of high speed dividers, since the clocking rate is only limited by logic signal propagation within each flip-flop plus one additional "feedback" inverter delay. In addition, a Johnson counter divides its input clock frequency in proportion to the number of flip-flop stages; namely, a conventional n-bit Johnson counter (i.e., a Johnson counter having "n" flip-flops cascaded together) divides the input signal frequency by "2n".

Figure 3:
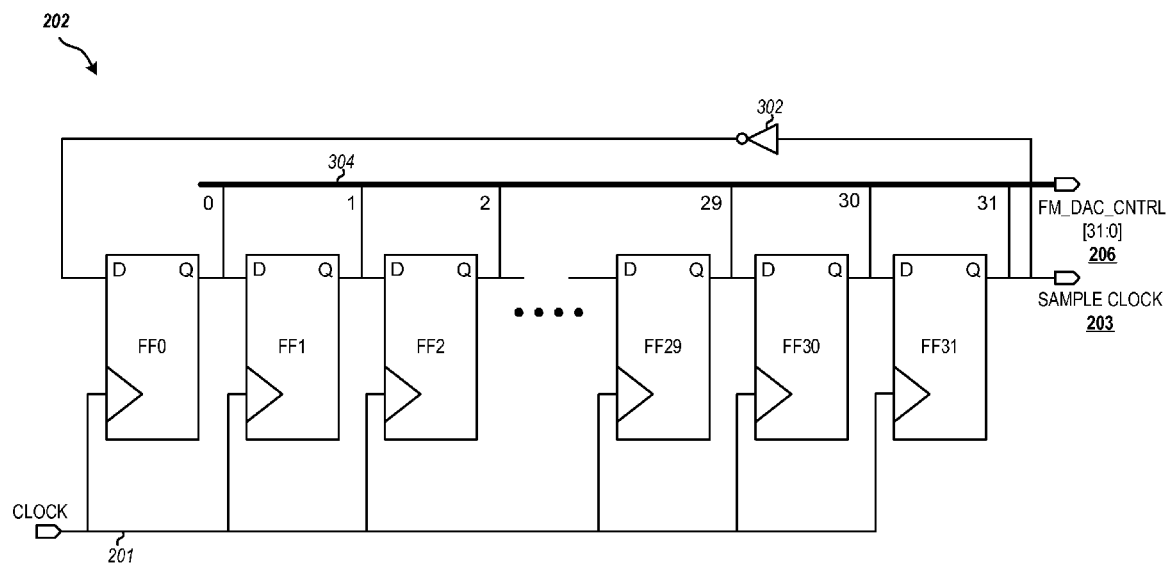
FIG. 3 shows a block diagram of a Johnson Counter generating the FM control word for driving the FM DAC, in accordance with a preferred embodiment of the present invention.

With reference now to FIG. 3, there is shown a block diagram of a Johnson Counter generating the FM control word for driving the FM DAC, in accordance with a preferred embodiment of the present invention. Sample counter/FM counter 202 receives common reference clock 201 at the clock input of each of its 32 D-type, flip-flops (FF0-FF31). The flip-flops FF0-FF31 are cascaded by coupling the 'Q' output signal line of each stage to the 'D' data input of the next flip-flop stage. For last stage flip-flop FF31, the 'Q' output is inverted by inverter 302 before coupling to the 'D' input of stage zero FF0. The 'Q' outputs of all flip-flops, FF0-FF31 are output on bus 206 to the FM DAC. Common engineering practice utilizes reset inputs to all flip-flops for initialization at power up, or an "anti-lock" circuit in the feedback path to prevent an alternating "1010 . . ." pattern from circulating endlessly within the counter. The 'Q' output of FF31 is employed to define output sample clock 203. As is well known by those skilled in the art, when beginning from a state where all 'Q' outputs are negated, e.g. an "all zeros" state, a 32-flip-flop Johnson Counter will increment its value by one, for each clock edge, as the logical "one" signal progresses from stage to stage, until all 32 flip-flops have a 'Q' output asserted, all "ones" state. Once FF31 has a 'Q' output asserted, inverter 302 will negate the 'D' input of FF0, until the entire "zero" state has propagated through to last stage FF31, at which time the output 'Q' of FF31 will be "zero" and inverter 302 will feedback a logic "one". Hence, the 'Q' output of each flip-flop stage FF0-FF31 will produce a square wave shifted by one clock per stage, and having a frequency equal to the frequency of reference clock 201 divided by 64. In accordance with a preferred embodiment of the present invention, each 'Q' output of flip-flops FF0-FF31 is also coupled to a corresponding control bit line on FM DAC control bus 206. Each bit of FM DAC control bus 206 drives an equally weighted leg of FM DAC 208.

Figure 4:
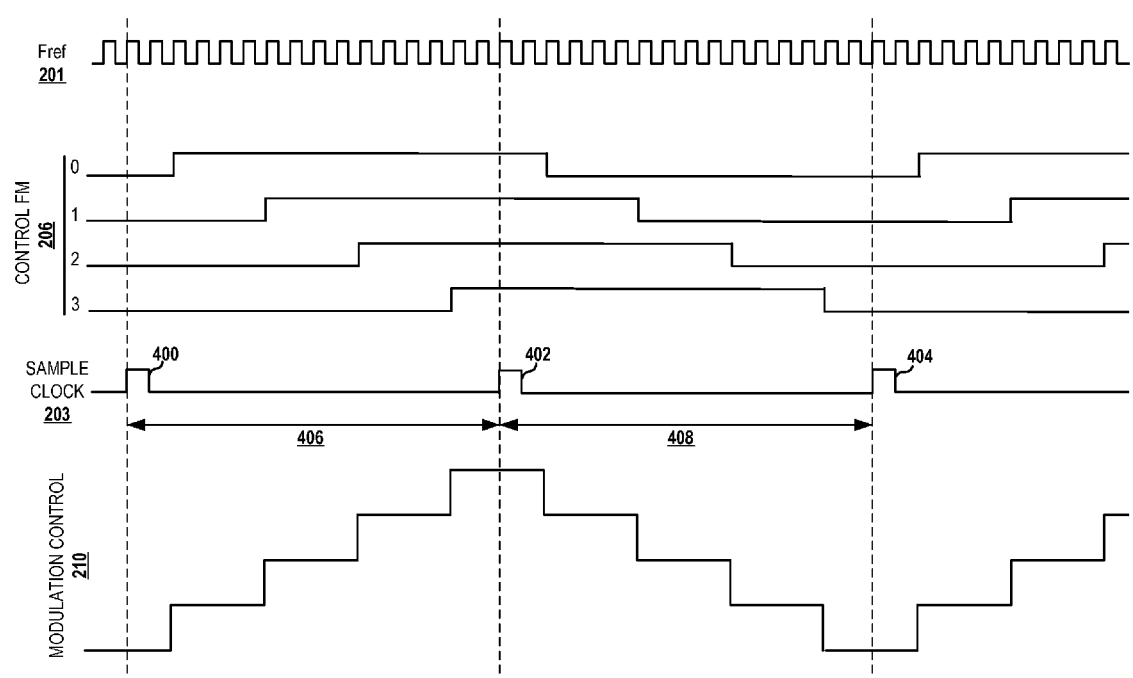
FIG. 4 shows a representative timing diagram of a frequency-modulated digital locked loop, in accordance with a preferred embodiment of the present invention.

With reference now to FIG. 4, there is shown a timing diagram for a FM DLL, in accordance with a preferred embodiment of the present invention. To simplify the description, FIG. 4 shows a timing diagram for a 4-bit sample counter/FM counter 202, having taps to FM DAC control bus 304 at FF7, FF15, FF23, FF31 instead of the 32-bit counter described in the embodiment of FIG. 3. FM DLL 200 receives reference clock (Fref) 201 at the clock inputs of 4 flip-flops contained within sample/frequency modulation counter 202. FM DAC control word 206 is output on 4-bit bus 206 coupled to the input of FM DAC 208. A pulse is generated on sample clock 203 by logic and sample counter/FM counter 202 when the last flip-flop in the Johnson Counter (in this example flip-flop 4) is clocked with a data input set by the previous flip-flop. Sample clock 203 pulse 400 occurs in the center of the counter value equal to zero from the prior modulation "staircase". The modulation control signal 210 is shown as stepping monotonically with each bit increase of signal 206 at the input of FM DAC 208. As will be appreciated, this generates the frequency modulation at the input of adder 212. Because the frequency can be measured over as little as one half of a modulation cycle (e.g., ramp up from minimum to maximum, or ramp down from maximum to minimum), the sample must be measured from the time from the center of the minimum value to the time at the center of the maximum value in order to effectively measure the average or center frequency. Thus, sample clock 203 pulse 402 occurs at the end of a positive ramp, or "staircase", in the center of the highest positive value of modulation control signal 210. The next possible frequency measurement interval is the negatively sloped ramp, or downward "staircase", on modulation control signal 210, which ends when sample clock 203 pulse 404 occurs. Importantly, modulation control signal 210 is synchronized with the center frequency signal 220 generated by Center DAC 218, which is triggered off of sample clock 203. In this way, there is no impact on the center frequency of oscillation control signal 222. Although there is no requirement that the frequency be measured for only one half cycle of the modulation control waveform, this is a minimum amount. In fact, for certain relationships between the clock frequency and the rate at which the clock frequency is modulated by frequency modulation control signal 210, it might be preferable for frequency measurement counter 226 to count over one complete frequency modulation period, from sample clock 203 pulse 400 to sample clock 203 pulse 404, or even for multiple modulation control cycles, M, with the possible addition of one half cycle, e.g. M+0.5K, where K only has values of one or zero.

With reference again to FIG. 2, counter 202 transmits sample clock 203 to a first input of frequency measurement counter 226. A second input of frequency measurement counter 226, received via bus 224 from Center Frequency Register, 222 comprises a numerical value corresponding to the desired center frequency to be produced by oscillator 214. A third input of frequency measurement circuit 226 receives feedback signal 228 from an output of multiply frequency divider 236. Frequency measurement counter 226 has output bus 230 corresponding to a multi-bit representation of the counter "residue", or measured frequency error, resulting from each frequency measurement.

An optional Limiter 232 has an input bus coupled to the output of frequency measurement circuit 226 at bus 230. Limiter 232 has output bus 234. Limiter 232 is a multi-bit, logical data path for modifying the numeric value that is allowed to pass from bus 230 to bus 234. This limiting value could be made fixed in hardware logic or made variable using a programmable register (not shown). Limiter 232 can fulfill at least two functional purposes: the first being to control the "slew-rate" at which the output frequency of oscillator 214 can change, thereby preventing sudden changes in operating current of the overall integrated circuit, which could adversely affect a power supply with limited current capability or response time; the second being to ensure stable operation of the loop under certain combinations of reference clock, multiply frequency MF, and the like.

Digital Filter 204 has a first input bus 234 from limiter 232 (if implemented) or from 230 (if Limiter 232 is not implemented). Digital Filter 204 has a second input coupled to sample clock signal 203 and an output signal bus 216. Digital Filter 204 is comprised of multi-bit adder 238 and multi-bit digital accumulator 240, which acts as an integrator. Adder 238 has a first input bus coupled to bus 234, a second input bus coupled to output bus 216 and an output bus 239. Digital Accumulator 240 has an input bus coupled to the output of adder 238 at bus 239, a second input coupled to sample clock 203 and that functions as a strobe, and an output bus coupled to output bus 216 of digital filter 204. Digital Accumulator 240 functions as an integrator in digital filter 204.

Center Frequency DAC 218 has an input bus coupled to the output of digital filter 204 at signal bus 216. Center Frequency DAC 218 has output signal 220. In practice, the output of Center Frequency DAC 218 can be a voltage or a current, according to the functional requirements and technology constraints on the design.

A Frequency Modulation DAC (FM DAC) has a first input coupled to sample/frequency modulation counter 202 via signal bus 206, a second input coupled to a frequency modulation enable signal 242 to enable or disable the output function, and an output 210. In practice, the output of Frequency Modulation DAC 208 can be a voltage or a current, according to the functional requirements and technology constraints on the design. In a preferred embodiment, FM DAC 208 is a 14-bit Binary Weighted DAC. It will be appreciated by those skilled in the art that FM DAC 208 can be a 4-bit, 8-bit or other resolution DAC in other embodiments, and that the present invention is not limited to the preferred embodiment of a 14-bit DAC. Further, it will be appreciated by those skilled in the art that FM DAC 208 can be of a pulse-width modulation, segmented, over sampling such as a sigma-delta or other type DAC in other embodiments, and that the present invention is not limited to the preferred embodiment of a Binary Weighted DAC Phase Detector 246 has a first input coupled to reference clock signal 201, a second input coupled to system clock signal 215, and output signal 248. The output of Phase Detector 246 is coupled to Phase DAC 250 via signal 248, having a parametric value that is substantially proportional to the degree of phase misalignment between the two input signals, 201 and 215. Phase Detector 246 can be any of those known in the art, such as, type II or type IV phase detectors, based on edge-triggered, D-type flip-flops, or another similar design.

Phase DAC 250 has a first input coupled to the output of Phase Detector 246 at signal 248, representing the phase error, a second input coupled to Phase Enable signal 244, coming from circuits not shown, and output 252. In practice, the output of Phase DAC 252 can be a voltage or a current, according to the functional requirements and technology constraints on the design. An alternative embodiment would allow Phase Enable signal 244 to be applied as a second input to phase detector 246 rather than as a second input to phase DAC 250. In either case, the goal would be to make the output of phase DAC 250 to have substantially no effect on oscillator 214.

Adder 212 has first input coupled to the output of center frequency DAC 218 at signal 220, second input coupled to the output of FM DAC 208 at signal 210, third input 252 coupled to the output of phase DAC 250, and an output coupled to signal 254. In practice, Adder 212 forms the algebraic sum of signals 220, 210 and 252 at output signal 254, which can be either a voltage or a current, according to the functional requirements and technology constraints on the design.

Oscillator 214 has an input for receiving signal 254 from adder 212, and output 215 that functions as system clock and whose signal comprises a variable frequency proportional to the control signal at its input 254.

Multiply Frequency divider 236 has an input coupled to the system clock output frequency, signal 215 and an output coupled to feedback signal 228. Multiply frequency divider 236 is programmed by means not shown to multi-bit binary values ranging from zero to N, and having a divider ratio of N+1, although in an alternate embodiment a different type of divider could be employed. If the multiply frequency divider 226 is programmed to binary "zero", control logic (not shown) directly couples system clock 215 to feedback signal 228. If multiply frequency divider 236 is programmed to a non-zero value MF, multiply frequency divider 236 produces a frequency at its output 228 that is equal to system clock 215 divided by a value of MF plus one (MF+1).

Taken together, center frequency DAC 218, FM DAC 208, phase detector 246, phase DAC 250, Adder 220, and oscillator 214 comprise digitally controlled oscillator (DCO) 256. Digitally controlled oscillator 256 has a first input bus coupled to bus 216, a second input bus coupled to bus 206, a third input coupled to reference clock 201, a fourth input coupled to control signal FM enable 242, a fifth input coupled to control signal phase enable 244, and an output coupled to system clock 215. Depending on the technology employed and the parametric and functional requirements of DLL 200, digitally controlled oscillator 256 could be implemented in various forms differing from the one described. For example, any of the center frequency DAC 218, FM DAC 208, or phase error DAC 250 could be directly combined into certain oscillator designs facilitating the elimination of their corresponding inputs 220, 210, or 252 to adder 212. For this reason, the techniques for calibrating the oscillator response to produce the desired percentage of frequency modulation have not been detailed herein, as they do not alter the general operation or characteristics of DLL 200.

An optional limiter 232 can be implemented to logically restrict the range of numbers represented by the output of adder 238. The purpose of limiter 232 is to ensure stability of the control loop under various loop programming conditions. The limiter 232 can also be employed to slew-rate limit the frequency change of the system clock, in order to prevent sudden, excessive current demand from the power supply circuit in which the DFMLL is found. For example, if the system clock frequency is near zero when the DFMLL begins operation, then frequency measurement circuit 226 will produce a residue value nearly equal to center frequency value 224, provided by center frequency register 222. However, if the accumulator was allowed to suddenly increment to this value, a nearly ideal "step response" full current would be imposed on the power supply. If, on the other hand, the limiter 232 effectively truncated the most significant magnitude bits of the residue from adder 238, then digital filter output 216 would only be incremented by the value equivalent to the change allowed by limiter 232.

The frequency at which the center frequency is modulated by control bus 206 and FM DAC 210 is reference frequency 201 divided by the divider ratio of sample/frequency modulation counter 202, and if the frequency is measured as in the preferred embodiment at one half the period of modulation control signal 210, then the apparent frequency on sample clock 203 is twice the actual modulation frequency. If some other multiple M+0.5*K, is chosen, the sample frequency is adjusted accordingly.

The number of bits required in center frequency register 222 can be reduced, if the number of steps between samples of the sample/frequency modulation counter is a multiple of 2 to an exponent, F, e.g. a binary number. Thus, the number stored in center frequency register 222 is the actual average number of cycles expected by frequency measurement counter 226 during the chosen sample period, divided by the number of cycles of reference clock 202 that make up each sample period, e.g. equal to $2^F$. The output bus 224 from center frequency register 222 is then left shifted in value by F positions, e.g. multiplied by $2^F$, with all rightmost bits being negated. Thus, the average output frequency is a multiple of reference clock frequency 201 and the number of steps of frequency modulation, as determined by sample/frequency modulation counter 202 for each sample clock 203, multiplied by the value of the multiply frequency counter 236 in the feedback loop.

If the intended system clock frequency is a multiple of reference clock frequency 201, then frequency divider 236 is usually programmed to divide by an integer value, N, greater than one. However, in some types of DLLs, 236 can be programmed to differing values during use, thereby producing non-integer division ratios, which is commonly done in communication systems having small "channel" frequency separations.

At the beginning of each frequency measurement interval, as determined by sample counter 202, counter 226 is pre-loaded with the desired center frequency value on bus 224 from center frequency register 222. Once pre-loaded, frequency measurement counter 226 decrements by one count for each rising edge of feedback signal 228. Conversely, frequency measurement counter 226 could decrement for each falling edge of signal 228, with substantially identical results. At the end of the frequency measurement interval, the output of frequency measurement counter 226 on bus 230 represents a multi-bit "residue" value corresponding to frequency error, that is, the difference between the feedback signal frequency and the intended center frequency, represented as a 2's complement, binary number. Also at the end of the frequency measurement interval, sample clock 203 "strobes" digital filter 204 and again pre-loads frequency measurement counter 226 with the value from bus 224, in preparation for the next frequency measurement interval.

The output value from frequency measurement counter 226 on bus 230 has the following characteristics:

If at the end of the frequency measurement interval, the average system clock oscillator frequency on 215 had been lower than the intended center frequency, the frequency measurement counter 226 would contain a positive, non-zero binary number on bus 230, which might be modified by limiter 232, but coupled via bus 234 (or 230, if limiter 232 is omitted) to the input of digital filter 204. Thus, the output of digital filter 204 would be increased in value by adder 238 and digital accumulator 240 on bus 216.

However, if at the end of the frequency measurement interval, the average system clock frequency on 215 had been equal to the intended center frequency, the frequency measurement counter residue would contain a binary value of "zero" on bus 230, which would be coupled via bus 234 (or 230, if limiter 232 is omitted) to the input of digital filter 204. Thus, the output of digital filter 204 would not be changed in value by adder 238 and digital accumulator 240 on bus 216.

Finally, if at the end of the frequency measurement interval, the average system clock frequency on 215 has been greater than the intended center frequency, the frequency measurement counter may "underflow" producing the two's complement representation of a negative number. When this two's complement, negative value is added to accumulator output value 216 by adder 238, the resultant number at output 239 is strobed into digital accumulator 240 as a lesser value than the prior sample, and is then applied via bus 216 to center DAC 218, thereby causing a reduction in frequency of oscillator 214.

If the desired mode of operation is to produce a frequency multiple of the reference clock frequency with frequency modulation of the system clock 215, then frequency modulation can be enabled by asserting FM enable signal 242. Conversely, frequency modulation can be disabled while producing a frequency multiple of the reference clock frequency by negating FM enable signal 242.

FM DAC 208 converts the digital control signal 206 to an analog FM signal 210. Because of a potential non-linear relationship between the input values to center frequency DAC 218 and FM DAC 208, when operating oscillator 214 over a wide range of frequencies, a calibration technique is employed, but not detailed in this specification, to adjust the scaling of FM control signal 210 relative to the desired frequency variation to be produced on system clock 215. Thus the output frequency is generated with a peak-to-peak variation corresponding to a desired variation of system frequency, such as an 8MHz swing in the output clock frequency over a period of modulation of 200 KHz. The frequency modulation rate is set by the frequency of reference clock 201 and the divide ratio of sample/frequency modulation counter 202, which is two times the number of stages in the Johnson counter.

Analog center frequency signal 220 can represent a frequency on oscillator 214 of 40 MHz, for example. Center frequency signal 220 is received at the input of adder 212 to be combined with FM signal 210 and "null" signal 252 to generate FM center frequency signal 254. In one example, the center frequency of 40 MHz is frequency modulated from between 36 MHz and 44 MHz at a rate of 200 KHz on the output 215 to affect the benefits of EMI reduction. Because center frequency 220 and FM signal 210 are derived from the same counter 202 and therefore inherently synchronized, a synchronized addition is performed by adder 212 resulting in a frequency modulated signal that has no fluctuation in the average center frequency.

Center DAC 218 is coupled to the output of digital filter 204 to receive control signal 216 and converts control signal 216 to an analog center frequency signal 220 specifying a center frequency of system clock output 215.

If the mode of operation is to make the system clock frequency equivalent and phase locked to the reference clock frequency, then FM enable signal 242 must be negated and phase enable signal 244 must be asserted. In this mode of operation, frequency measurement counter 226 is still employed to measure and adjust system clock frequency 215 by means of error signal 230 coupled to digital filter 204, Center Frequency DAC 218, adder 212, and oscillator 214. In addition to the aforementioned blocks, once frequency lock is attained, phase detector 246 will control the output of phase DAC 250 at signal 252. Now the control signal 254 is comprised only of signals 220 and 252 thus controlling both the frequency and the phase of oscillator 214, as seen on system clock 215.

As will be appreciated, the processes in preferred embodiments of the present invention may be implemented using any combination of computer programming software, firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code for remote execution. The method form of the invention may be practiced by combining one or more machine-readable storage devices containing the code according to the present invention with appropriate standard computer hardware to execute the code contained therein. An apparatus for practicing the invention could be one or more computers and storage systems containing or having network access to computer program(s) coded in accordance with the invention.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. An apparatus comprising:
    a counter having an input for receiving a reference clock signal, a first output for providing a sample clock signal, and a second output;
    a frequency measurement device having a first input coupled to the sample clock, a second input coupled to a feedback signal, and an output for providing a digital error signal indicating a difference between the ratio of the reference and actual feedback clocks;
    a digital device having a first input coupled to the sample clock signal, a second input coupled to a digital error signal, and an output for providing a filtered digital error signal;
    a summing device having a first input coupled to the filtered error signal, a second input and an output for providing an oscillator control signal resulting from a combination of the filtered error signal and the second input; and
    an oscillator having an input coupled the frequency control signal and an output for providing a timing signal, wherein the feedback signal is derived from the timing signal,
    wherein the second output of the counter having a multi-bit representation of a frequency modulation control signal value is coupled to the second input to the summing device.

2. The apparatus of claim 1, comprising,
    a phase detector device having a first input coupled to a reference clock signal, a second input coupled to a feedback signal from the timing output, and an output representing the phase difference between the two signals that is coupled to the second input of the summing device for the purpose of coupling a phase correction signal to the oscillator.

3. The apparatus of claim 1, wherein the digital device is a digital loop filter.

4. The apparatus of claim 1, wherein the counter is a Johnson Counter.

5. The apparatus of claim 1, wherein the counter generates a plurality of digital bit output signals on one or more digital bit output signal lines, the counter including a plurality of flip-flops cascaded together, each output of the plurality of flip-flops coupled to the one or more digital bit output signal lines to provide frequency conversion of the reference clock signal to a frequency modulation signal having a desired frequency relative to the reference clock signal.

6. The apparatus of claim 5, wherein each of the one or more digital bit output signal lines is received at an equally weighted input of a digital-to-analog converter.

7. The apparatus of claim 1, further comprising a digital-to-analog converter receiving the output of the digital device to generate an analog form of the error signal at its output.

8. A method for generating an oscillation signal of a digital locked loop, the method comprising the steps of:
    converting a reference clock signal to generate a divided sample clock signal at a first output of a counter;
    converting a reference clock signal to generate a divided frequency modulation signal at a second output of a counter, wherein the frequency modulated signal is synchronized with the sample clock signal;
    generating an error signal indicative of a frequency relationship between a reference clock signal and a feedback signal;
    filtering the frequency error signal to produce a control signal;
    combining the control signal with a second signal to control an oscillation signal; and
    deriving the feedback signal from the oscillation signal.

9. The method of claim 8, further comprising, coupling the second output of the counter having a multi-bit representation of a frequency modulation control signal value to the second input to the summing device.

10. The method of claim 8, further comprising,
coupling a phase detector device having a first input to a reference clock signal, a second input coupled to a feedback signal from the timing output, and an output representing the phase difference between the two signals to the second input of the adder thereby coupling a phase correction signal to the oscillator.

11. The method of claim 8, wherein the step of combining includes frequency modulating the control signal with the frequency modulated signal.

12. The method of claim 8, further comprising the steps of:
generating a plurality of sample signals;
generating intermediate count signals from a counter between generating the plurality of sample signals; and
generating the frequency modulated signal from the intermediate count signals.

13. The method of claim 8, wherein the step of filtering is performed by a digital filter.

14. The method of claim 8, wherein the step of converting is performed by a Johnson Counter.

15. The method of claim 8, wherein the digital locked loop is a digital frequency locked loop.

* * * * *